United States Patent
Dalton et al.

(10) Patent No.: US 7,365,412 B2
(45) Date of Patent: Apr. 29, 2008

(54) VERTICAL PARALLEL PLATE CAPACITOR USING SPACER SHAPED ELECTRODES AND METHOD FOR FABRICATION THEREOF

(75) Inventors: Timothy J. Dalton, Ridgefield, CT (US); Jeffrey P. Gambino, Westford, VT (US); Anthony K. Stamper, Williston, VT (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 11/279,434

(22) Filed: Apr. 12, 2006

(65) Prior Publication Data

US 2007/0241424 A1    Oct. 18, 2007

(51) Int. Cl.
*H01L 29/00* (2006.01)

(52) U.S. Cl. .................. 257/534; 257/532; 257/71; 257/E21.008; 257/E21.35

(58) Field of Classification Search ............ None
See application file for complete search history.

(56) References Cited

U.S. PATENT DOCUMENTS 4,017,885 A    4/1977    Kendall et al.
4,896,197 A *  1/1990    Mashiko .................. 257/303
6,136,640 A    10/2000   Marty et al.
6,365,452 B1   4/2002    Perng et al.
6,528,366 B1   3/2003    Tu et al.
6,739,028 B2 * 5/2004    Sievenpiper et al. ........ 29/25.42
6,885,544 B2   4/2005    Kim et al.
2003/0020107 A1 * 1/2003 Bosco et al. .............. 257/296

* cited by examiner

*Primary Examiner*—A. Sefer
*Assistant Examiner*—Scott R Wilson
(74) *Attorney, Agent, or Firm*—Scully, Scott, Murphy & Presser; Lisa U. Jaklitsch (57) ABSTRACT

A capacitor structure uses an aperture located within a dielectric layer in turn located over a substrate. A pair of conductor interconnection layers embedded within the dielectric layer terminates at a pair of opposite sidewalls of the aperture. A pair of capacitor plates is located upon the pair of opposite sidewalls of the aperture and contacting the pair of conductor interconnection layers, but not filling the aperture. A capacitor dielectric layer is located interposed between the pair of capacitor plates and filling the aperture. The pair of capacitor plates may be formed using an anisotropic unmasked etch followed by a masked trim etch. Alternatively, the pair of capacitor plates may be formed using an unmasked anisotropic etch only, when the pair of opposite sidewalls of the aperture is vertical and separated by a second pair of opposite sidewalls that is outward sloped.

10 Claims, 6 Drawing Sheets

VERTICAL PARALLEL PLATE CAPACITOR USING SPACER SHAPED ELECTRODES AND METHOD FOR FABRICATION THEREOF

BACKGROUND

1. Field of the Invention

The invention relates generally to microelectronic capacitor structures and methods of fabricating the same. More particularly, the invention relates to enhanced performance microelectronic capacitor structures and methods for fabricating the same.

2. Description of the Related Art

Capacitors find many uses within microelectronic circuits. For example, capacitors may be used as charge storage devices within digital semiconductor memory circuits. Alternatively, capacitors may be used as signal processing devices within analog semiconductor circuits, or they may also be used as decoupling devices within ceramic substrate circuits. Capacitors within microelectronic circuits may also comprise any of several form factors. Common form factors include stacked container capacitors, crown shaped capacitors and planar capacitors.

A particularly simple capacitor structure is a parallel plate capacitor. Parallel plate capacitors may be constructed with parallel plates that are either horizontal or vertical with respect to a surface of a substrate. Vertical parallel plate capacitors have an advantage over horizontal parallel plate capacitors insofar as processing for vertical parallel plate capacitors is often simpler. However, horizontal parallel plate capacitors often have a superior capacitance density and a higher quality factor (i.e., a ratio of energy stored to energy dissipated) in comparison with vertical parallel plate capacitors.

Various capacitor structures are disclosed in the art. Non-limiting examples include: (1) Kendall et al., in U.S. Pat. No. 4,017,885 (a capacitor that uses a directionally specifically etched semiconductor substrate as a plate layer); (2) Marty et al., in U.S. Pat. No. 6,136,640 (a metal-insulator-metal (MIM) capacitor within an integrated circuit); (3) Perng et al., in U.S. Pat. No. 6,365,452 (a vertical sidewall capacitor used in a DRAM cell); (4) Tu et al., in U.S. Pat. No. 6,528,366 (a vertical capacitor used in a DRAM cell); and (5) Kim et al., in U.S. Pat. No. 6,885,544 (a capacitor intended for use within a circuit board).

Microelectronic structure dimensions are certain to continue to decrease. As a result thereof, a need exists for forming microelectronic capacitor structures with enhanced performance, including an enhanced capacitance density and an enhanced quality factor, at decreased capacitor dimensions.

SUMMARY OF THE INVENTION

The invention provides capacitor structures and methods for fabricating the capacitor structures. The capacitor structures and the methods use a pair of spacer shaped capacitor plate electrodes located and formed covering opposite sidewalls of an aperture located within a dielectric layer, but not filling the aperture. The pair of capacitor plates also contacts a pair of conductor interconnection layers that is embedded in the dielectric layer and terminates at the aperture. A capacitor dielectric layer fills the aperture.

The capacitor structures and methods of the instant invention provide that the pair of spacer shaped capacitor plate electrodes may comprise conductor materials different from conductor materials from which are comprised the pair of conductor interconnection layers. The inventive capacitor structures and methods also provide that the dielectric layer having the aperture located therein may, in comparison with the capacitor dielectric layer, also comprise different dielectric materials. Due to the foregoing differences of dielectric materials and conductor materials for the active capacitor structure (i.e., capacitor plates and capacitor dielectric layer) and the surrounding interconnection and dielectric isolation structure, a capacitor structure in accordance with the invention may possess an enhanced capacitance density and an enhanced quality factor. For example, a capacitor structure in accordance with the invention may have: (1) a capacitance density increase from about 50 to about 400 percent; and (2) a quality factor increase from about 10 to about 50 percent, in comparison with an otherwise identical capacitor structure that does not provide for differences between: (1) dielectric materials and conductor materials for an active capacitor structure; in comparison with (2) dielectric materials and conductor materials for a surrounding interconnection and dielectric isolation structure.

In one embodiment of the present invention, the capacitor structure includes a dielectric layer located over a substrate. The dielectric layer has at least one aperture located therein. The capacitor structure in this embodiment of the present invention also includes a pair of conductor interconnection layers embedded within the dielectric layer. The pair of conductor interconnection layers terminates at a pair of opposite sidewalls of the aperture. The capacitor structure of this embodiment also includes a pair of capacitor plates located upon the pair of opposite sidewalls of the aperture and contacting the pair of conductor interconnection layers. The pair of capacitor plates does not fill the aperture. The capacitor structure of this embodiment of the present invention also includes a capacitor dielectric layer located interposed between the pair of capacitor plates and filling the aperture.

In another embodiment of the present invention, a second capacitor structure is provided which includes a dielectric layer located over a substrate. The dielectric layer has at least one aperture located therein. The aperture has a first pair of opposite sidewalls that is at least substantially vertical and a second pair of opposite sidewalls that is interposed between the first pair of opposite sidewalls. The second pair of opposite sidewalls is at least substantially sloped. The capacitor structure of this particular embodiment also includes a pair of conductor interconnection layers embedded within the dielectric layer. The pair of conductor interconnection layers terminates at the first pair of opposite sidewalls of the aperture. The capacitor structure also includes a pair of capacitor plates located upon the first pair of opposite sidewalls of the aperture and contacting the pair of conductor interconnection layers. The pair of capacitor plates does not fill the aperture. The capacitor structure of this embodiment also comprises a capacitor dielectric layer located interposed between the pair of capacitor plates and filling the aperture.

One method in accordance with the invention includes forming an aperture (e.g., at least one) within a dielectric layer located over a substrate, so that a pair of conductor interconnection layers embedded within the dielectric layer terminates at a pair of opposite sidewalls of the aperture. This particular method of the present invention also includes forming a pair of capacitor plates upon the pair of opposite sidewalls of the aperture and contacting the pair of conductor interconnection layers. The pair of capacitor plates does not fill the aperture. This method further includes forming a capacitor dielectric layer located interposed between the pair of capacitor plates and filling the aperture.

In another method in accordance with the invention, an aperture is first formed within a dielectric layer located over a substrate. The aperture has a first pair of opposite sidewalls that is at least substantially vertical and a second pair of opposite sidewalls that is at least substantially sloped and that also separates the first pair of opposite sidewalls. In addition, a pair of conductor interconnection layers embedded within the dielectric layer terminates at the first pair of opposite sidewalls. This particular method also includes forming a pair of capacitor plates located upon the first pair of opposite sidewalls of the aperture and contacting the pair of conductor interconnection layers. The pair of capacitor plates does not fill the aperture. This method further includes forming a capacitor dielectric layer located interposed between the pair of capacitor plates and filling the aperture.

Within the embodiments and invention as disclosed and claimed, a "substantially vertical" aperture sidewall is intended as having a sidewall angle from about 85 to about 90 degrees with respect to a substrate, while a "substantially sloped" aperture sidewall is intended as having a sidewall angle from about 45 to about 85 degrees with respect to a substrate.

BRIEF DESCRIPTION OF THE DRAWINGS

The objects, features and advantages of the invention are understood within the context of the Description of the Preferred Embodiment, as set forth below. The Description of the Preferred Embodiment is understood within the context of the accompanying drawings, which form a material part of this disclosure, wherein.

DESCRIPTION OF THE PREFERRED EMBODIMENTS

The invention, which includes capacitor structures and related methods for fabricating the capacitor structures, will be described in greater detail below, by reference to the drawings described above. The drawings are intended for descriptive purposes, and thus are not necessarily drawn to scale.

Figure 1:
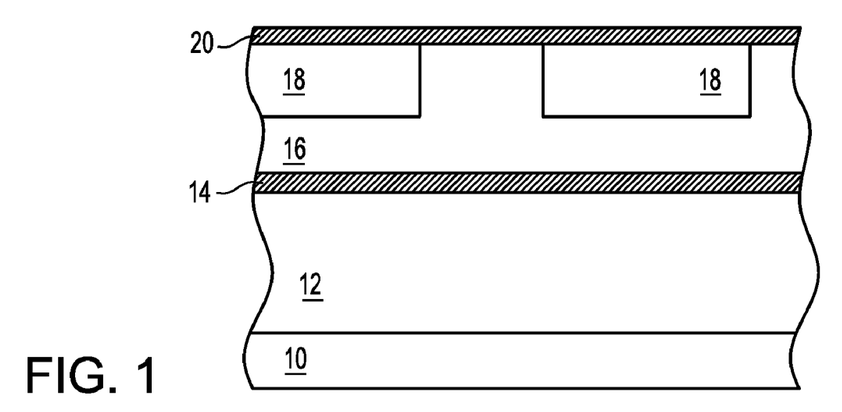
FIG. 1 to FIG. 11 show a series of schematic cross-sectional and plan-view diagrams illustrating the results of progressive stages in fabricating a capacitor structure in accordance with a first embodiment of the invention.

FIG. 1 to FIG. 11 show a series of schematic cross-sectional and plan-view diagrams illustrating the results of progressive stages in fabricating a capacitor structure in accordance with a first embodiment of the invention. FIG. 1 shows a schematic cross-sectional diagram of the capacitor structure at an early stage in its fabrication in accordance with the first embodiment.

Specifically, FIG. 1 shows a substrate 10 having a first dielectric layer 12 located thereupon. An etch stop layer 14 is located upon the first dielectric layer 12. A second dielectric layer 16 is located upon the etch stop layer 14. The initial structure shown in FIG. 1 also includes a pair of conductor interconnection layers 18 embedded within the second dielectric layer 16. A capping layer 20 is located upon and covering exposed portions of the conductor interconnection layers 18 and the second dielectric layer 16.

Each of the foregoing layers may comprise materials, have dimensions and be formed using methods that are conventional in the microelectronic fabrication art.

The substrate 10 may comprise any of several substrate materials, including but not limited to: semiconductor substrate materials and ceramic substrate materials. Non-limiting examples of semiconductor substrate materials include silicon, germanium, silicon-germanium alloy, silicon carbide and silicon-germanium carbide alloy semiconductor materials. Also included are compound semiconductor materials of which gallium arsenide, indium arsenide and indium phosphide are non-limiting examples. Non-limiting examples of ceramic substrate materials include silica, alumina, titania and zirconia ceramic substrate materials, as well as composites thereof and laminates thereof. Typically, the substrate 10 has a thickness from about 1 to about 3 mils.

Within the context of semiconductor materials, the substrate 10 may comprise a bulk semiconductor substrate, or in the alternative the substrate 10 may comprise a semiconductor-on-insulator substrate. A semiconductor-on-insulator substrate comprises a base semiconductor substrate, a buried dielectric layer located thereupon and a surface semiconductor layer located further thereupon. Semiconductor-on-insulator substrates may be fabricated using any of several methods. Non-limiting examples include layer transfer methods, laminating methods and separation by implantation of oxygen (SIMOX) methods. Finally, the instant embodiment also contemplates use of a hybrid orientation (HOT) substrate as the substrate 10. A hybrid orientation substrate comprises multiple semiconductor regions of differing crystallographic orientations.

Although also not specifically illustrated in FIG. 1, the embodiment also contemplates that microelectronic devices or semiconductor devices may be located within the substrate 10. Such devices may include, but are not limited to: resistors, transistors, diodes and/or capacitors.

The first dielectric layer 12 and the second dielectric layer 16 may comprise the same or different dielectric material. The dielectric materials may comprise comparatively high dielectric constant dielectric materials having a dielectric constant from about 4 to about 20, measured in a vacuum. Non-limiting examples of such dielectric materials include oxides, nitrides and oxynitrides of silicon. Oxides, nitrides and oxynitrides of other elements are not excluded. The dielectric materials may also comprise comparatively low dielectric constant dielectric materials having a dielectric constant from about 2 to about 4, measured in a vacuum. Non-limiting examples of such lower dielectric constant dielectric materials include aerogels, hydrogels, carbon doped silicate glasses, fluorinated silicate glasses, spin-on-glasses, organic polymers and fluorinated organic polymers. The dielectric materials may be formed using methods that are appropriate to their materials of composition. Non-limiting examples include spin-coating methods, chemical vapor deposition methods and physical vapor deposition methods. Preferably, each of the first dielectric layer 12 and the second dielectric layer 16 comprises a hydrogenated carbon doped silicon oxide material (i.e., SiCOH) having a Si:C:O:H atomic ratio from about [10:10:20:30] to about [35:40:30:50] (i.e. Si=10 to 35 at %, C=10 to 40 at %, etc.), and a thickness from about 1,000 to about 80,000 angstroms.

Each of the etch stop layer 14 and the capping layer 20 may also comprises the same or different materials that possess etch stop properties and/or capping (i.e., barrier, planarizing stop or related) properties. Such materials may include, but are not limited to: nitrides and oxynitrides of silicon. Carbides of silicon are also contemplated. The materials may be formed using methods including, but not limited to: thermal or plasma oxidation or nitridation methods, chemical vapor deposition methods and physical vapor deposition methods. Typically, each of the etch stop layer 14 and the capping layer 20 comprises a silicon carbide based material having a thickness from about 200 to about 300 angstroms.

The conductor interconnection layers 18 may comprise any of several conductor materials. Included are certain metals, metal alloys, metal nitrides and metal silicides. Also included are doped polysilicon (i.e., having a dopant concentration from about 1e18 to about 1e22 dopant atoms per cubic centimeter) and polycide (doped polysilicon/metal silicide stack) materials. The foregoing conductor materials may be deposited using methods including, but not limited to: plating methods, chemical vapor deposition methods (including atomic layer chemical vapor deposition methods) and physical vapor deposition methods (including evaporation methods). Typically, each of the conductor interconnection layers 18 comprises a copper or aluminum core material that is encapsulated with a barrier material. Barrier materials may include dielectric barrier materials (i.e., such as, for example, silicon nitrides and silicon carbides) as well as conductor barrier materials (i.e., such as, for example, titanium, tantalum, tungsten and nitrides thereof, as well as cobalt-tungsten phosphorus alloys and related conductor barrier materials). Typically, the conductor interconnection layers 18 (including core layers and barrier layers) have a thickness from about 500 to about 40,000 angstroms.

Figure 2:
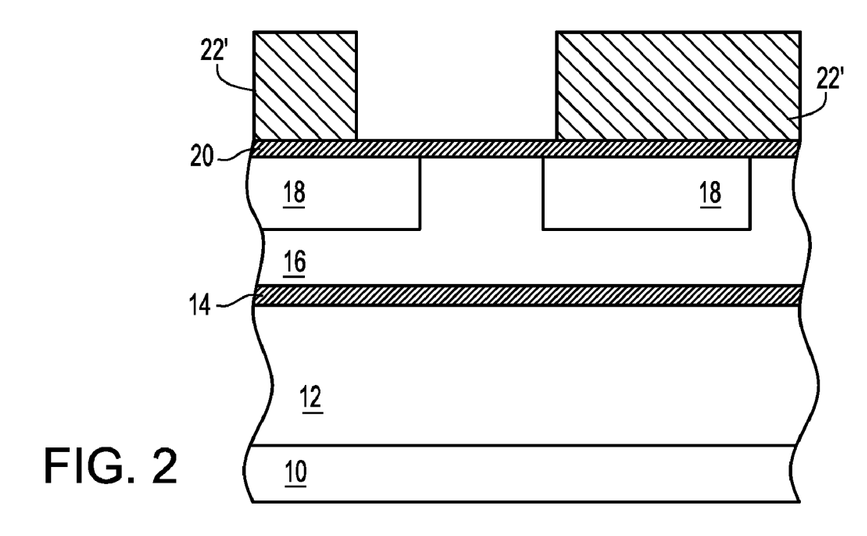

FIG. 2 shows a patterned photoresist layer 22' located upon the capping layer 20. The patterned photoresist layer 22' leaves uncovered a portion of the second dielectric layer 16 interposed between the conductor interconnection layers 18.

The patterned photoresist layer 22' may comprise photoresist materials that are conventional in the microelectronic fabrication art. Positive photoresist materials, negative photoresist materials and hybrid photoresist materials are examples of various photoresist materials that can be employed in the present invention. The photoresist materials may deposited, photoexposed and developed to form the patterned photoresist layer 22' while using methods that are convention in the microelectronic fabrication art.

Figure 3:
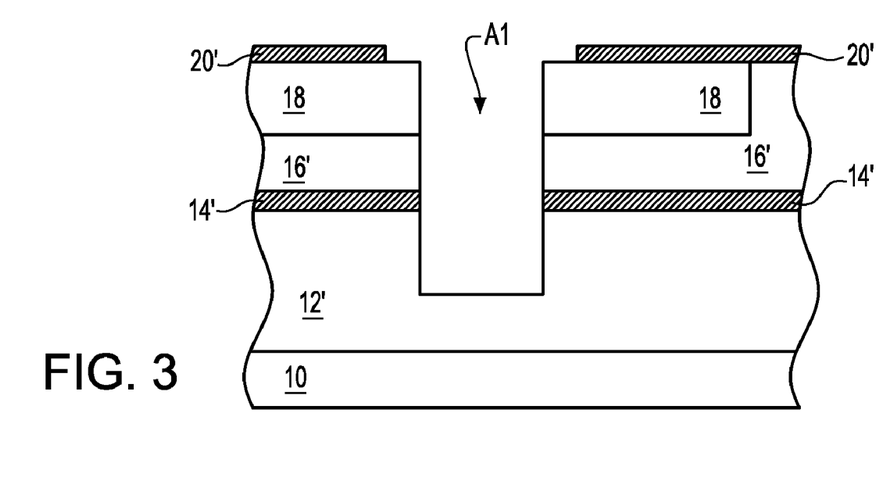

FIG. 3 shows the results of sequentially etching: (1) the capping layer 20 to form a patterned capping layer 20'; (2) the second dielectric layer 16 to form a patterned second dielectric layer 16'; (3) the etch stop layer 14 to form a patterned etch stop layer 14'; and (5) the first dielectric layer 12 to form an etched first dielectric layer 12' (i.e., the first dielectric layer is typically not completely patterned). In a first instance, the sequential etching uses the patterned photoresist layer 22' as an etch mask for etching a portion of the capping layer 20 to form the patterned capping layer 20'. In a second instance, the pair of conductor interconnection layers 18 then serves as a hard mask for forming the patterned second dielectric layer 16', the patterned etch stop layer 14' and the etched first dielectric layer 12' from the corresponding unpatterned or unetched layers.

The sequential etching is typically performed using a plasma etch method that provides nominally straight (i.e., substantially vertical) sidewalls to the patterned capping layer 20', the patterned second dielectric layer 16', the patterned etch stop layer 14' and the etched first dielectric layer 12'. In conjunction with the pair of conductor interconnection layers 18, the foregoing patterned or etched layers comprise an aperture A1 that is illustrated in FIG. 3. It should be emphasized that the present invention is not limited to forming a single aperture A1, but instead contemplates forming one or more apertures utilizing the above mentioned techniques. Under certain circumstances, a wet chemical etchant method may be used in the alternative of a plasma etch method. Typically, silicon containing dielectric materials may be etched using plasma etch methods that comprise fluorine containing etchant gas compositions. Neither the embodiment nor the invention is, however, so limited.

FIG. 3 also shows the results of stripping the patterned photoresist layer 22' that is illustrated in FIG. 2 from the patterned capping layer 20' that is illustrated in FIG. 3. The patterned photoresist layer 22' is typically stripped subsequent to completely forming the aperture A1, although the patterned photoresist layer 22' may alternatively be stripped at an intervening point prior to completely forming the aperture A1.

The patterned photoresist layer 22' may be stripped using methods and materials that are conventional in the microelectronic fabrication art. Included but not limiting are: wet chemical stripping methods and materials, dry plasma stripping methods and materials and aggregate stripping methods and materials thereof. Aggregate stripping methods and materials thereof are most common.

Figure 4:
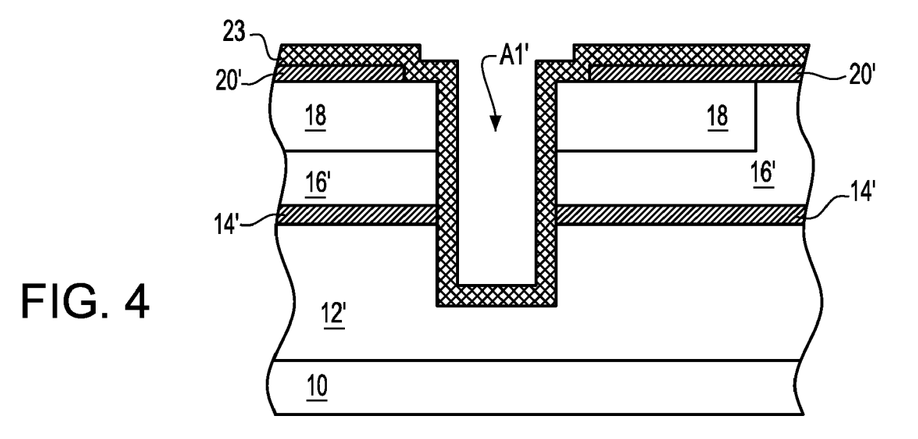

FIG. 4 shows the results of forming a capacitor plate material layer 23 upon the surface of the microelectronic structure whose schematic cross-sectional diagram is illustrated in FIG. 3. The capacitor plate material layer 23 is located covering exposed portions of the patterned capping layer 20', the conductor interconnection layers 18, the patterned second dielectric layer 16', the patterned etch stop layer 14' and the etched first dielectric layer 12'. As is illustrated in FIG. 4, the capacitor plate material layer 23 is formed conformally, and in particularly conformally into the aperture A1, thus yielding a partially filled aperture A1'.

The capacitor plate material layer 23 may comprise any of several capacitor plate materials that are conventional or unconventional in the microelectronic fabrication art. Non-limiting examples include: tantalum, tantalum nitride, tantalum silicon nitride, tungsten, platinum, ruthenium, ruthenium oxide, nickel, nickel silicide and tungsten silicide capacitor plate materials. The foregoing capacitor plate materials are not necessarily analogous, equivalent or identical to the conductor materials that comprise the conductor interconnection layers 18. Rather, they are generally different. Thus, the instant embodiment allows for a unique selection of: (1) conductor materials that comprise the conductor interconnection layers 18; and (2) conductor materials that comprise the capacitor plate material layer 23. The capacitor plate materials may be deposited using any of several methods that are appropriate to individual compositions of the capacitor plate materials. Non limiting examples include salicide methods, thermal or plasma nitridation methods, physical vapor deposition methods (including evaporation methods) and chemical vapor deposition methods (including atomic layer chemical vapor deposition methods). Typically, the capacitor plate material layer 23 has a thickness from about 200 to about 5000 angstroms. In addition, the capacitor plate material layer must have a thickness less than one half the aperture A1 width as illustrated in FIG. 3.

Figure 5:
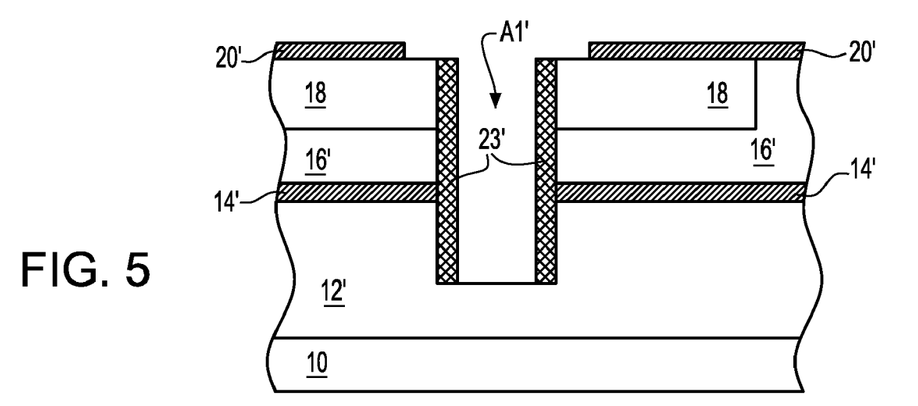

FIG. 5 shows the results anisotropically etching the capacitor plate material layer 23 to form an anisotropically etched capacitor plate material layer 23' that lines the sidewalls of an extended aperture A1". The anisotropic etching uses an anisotropic etch method that typically comprises a plasma etch method. Such an anisotropic plasma etch method uses an etchant gas composition appropriate to the material from which is comprised the capacitor plate material layer 23. With respect to the series of capacitor plate materials enumerated above, a fluorine-containing etchant gas composition may typically be used when anisotropically etching the capacitor plate material layer 23 to form the anisotropically etched capacitor plate material layer 23'.

Figure 6:
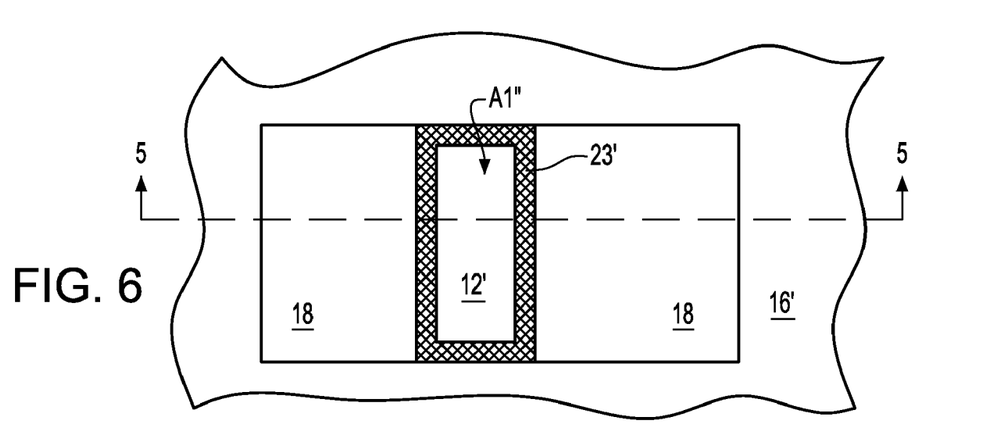

FIG. 6 shows a schematic plan-view diagram generally corresponding with the schematic cross-sectional diagram of FIG. 5. However, absent from FIG. 6 (although present in FIG. 3 to FIG. 5) is the patterned capping layer 20'. The patterned capping layer 20' is omitted in FIG. 6 (and also in subsequent plan-view diagrams including those used to describe the second embodiment) for clarity. The patterned capping layer 20' will continue to be shown in subsequent cross-sectional diagrams for both the first embodiment and the second embodiment.

FIG. 6 shows the patterned second dielectric layer 16' that surrounds the pair of conductor interconnection layers 18. Interposed between the pair of conductor interconnection layers 18 is the anisotropically etched capacitor plate material layer 23' that surrounds the extended aperture A1". At the base of the extended aperture A1" is an exposed portion of the etched first dielectric layer 12'.

Figure 7:
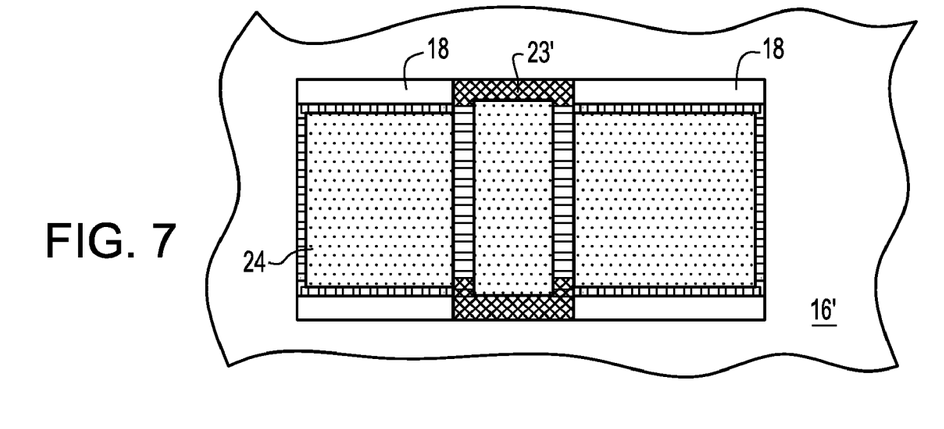

FIG. 7 shows a trim mask 24 located traversing a central portion of the anisotropically etched capacitor plate material layer 23' that is illustrated in FIG. 6. The trim mask 24 leaves exposed a pair of terminal portions of the anisotropically etched capacitor plate material layer 23' at a pair of opposite sidewalls of the extended aperture A1" that is illustrated in FIG. 6. The uncovered portions of the anisotropically etched capacitor plate material layer 23' are located at opposite portions thereof that do not contact the pair of conductor interconnection layers 18.

The trim mask 24 will typically comprise a patterned photoresist layer that comprises a photoresist material. The photoresist material may be analogous, equivalent or identical to the photoresist material from which is comprised the patterned photoresist layer 22' that is illustrated in FIG. 2.

Figure 8:
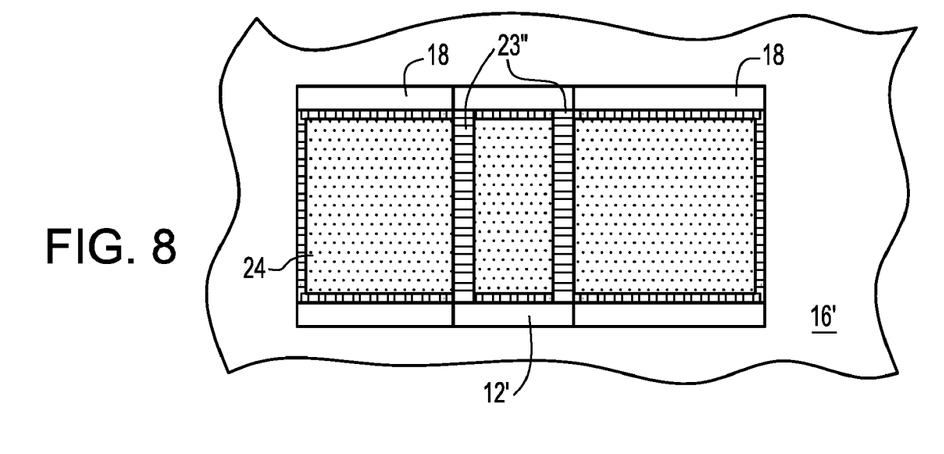

FIG. 8 shows the results of further etching of the anisotropically etched capacitor plate material layer 23' that is not covered by the trim mask 24 to thus form a pair of capacitor plates 23" (i.e., spacer shaped electrodes). Each one of the capacitor plates 23" contacts one of the conductor interconnection layers 18. Etching of the anisotropically etched capacitor plate material layer 23' to form the pair of capacitor plates 23" may be effected using the same etch methods that are used for etching the capacitor plate material layer 23 that is illustrated in FIG. 4 to form the anisotropically etched capacitor plate material layer 23' that is illustrated in FIG. 5. A major difference exists insofar as when etching the capacitor plate material layer 23 that is illustrated in FIG. 4 to provide the anisotropically etched capacitor plate material layer 23' that is illustrated in FIG. 5, there is no extrinsic masking thereof with a mask, such as the trim mask 24.

Figure 9:
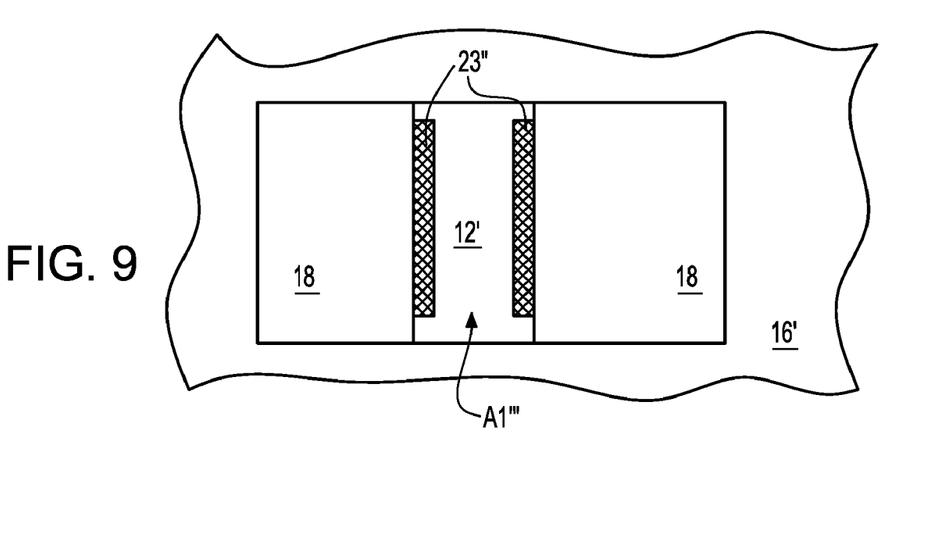

FIG. 9 shows the results of stripping the trim mask 24 from the microelectronic structure whose schematic plan-view diagram is illustrated in FIG. 8. Shown in FIG. 9 is the pair of capacitor plates 23" one each contacting the pair of conductor interconnection layers 18. The pair of capacitor plates 23" is located within an enlarged aperture A1'". FIG. 9 also shows the etched second dielectric layer 16' that surrounds the pair of conductor interconnection layers 23".

The trim mask 24 may be stripped using any of several methods and materials that are generally appropriate to the materials of composition of the trim mask 24. When the trim mask 24 comprises a photoresist material, the trim mask 24 may be stripped using photoresist stripping methods and materials that are used for stripping the patterned photoresist layer 20' that is illustrated in FIG. 2 to provide in part the microelectronic structure that is illustrated in FIG. 3.

Figure 10:
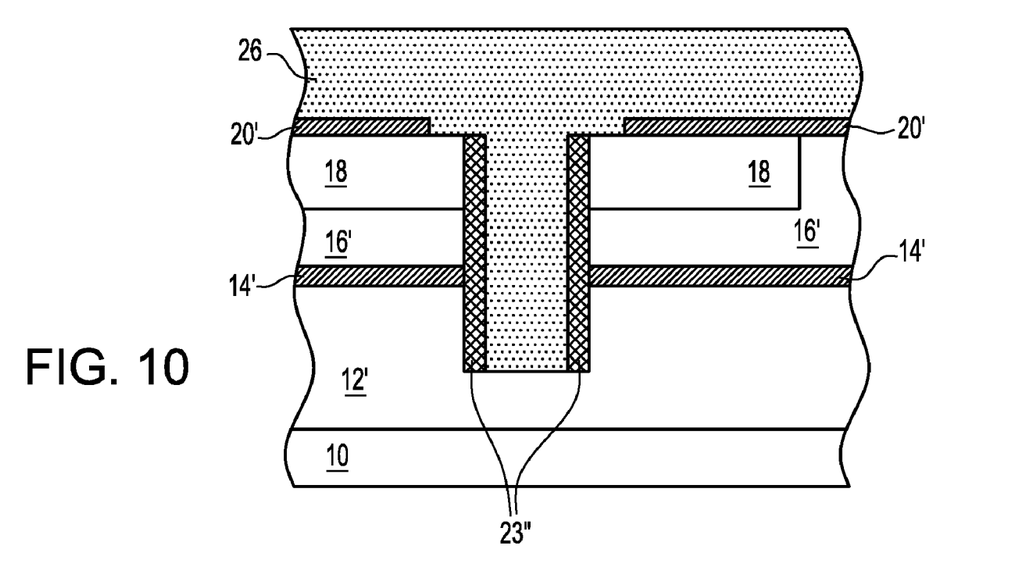

FIG. 10 shows a schematic cross-sectional diagram illustrating the results of further processing of the microelectronic structure whose schematic plan-view diagram is illustrated in FIG. 9. FIG. 10 shows a capacitor dielectric layer 26 located upon the microelectronic structure of FIG. 9 and completely filling the enlarged aperture A1'" that is illustrated in FIG. 9.

The capacitor dielectric layer 26 may comprise any of several dielectric materials. In a first instance, the capacitor dielectric layer 26 may comprise generally conventional capacitor dielectric materials having a comparatively low capacitive dielectric constant from about 4 to about 20, measured in vacuum. Non-limiting examples of such capacitor dielectric materials include oxides, nitrides and oxynitrides of silicon. Oxides, nitrides and oxynitrides of other elements are not excluded. Alternatively, the capacitor dielectric layer 26 may comprise dielectric materials having a generally higher capacitive dielectric constant from about 20 to at least about 100. Non-limiting examples of such dielectric materials include tantalum oxides, hafnium oxides, hafnium silicates, titanium oxides, barium-strontium titanates (BSTs) and lead-zirconate titanates (PZTs). Any of the foregoing capacitor dielectric materials (whether comparatively low dielectric constant or comparatively high dielectric constant) may be formed using methods that are appropriate to their materials of composition. Included are thermal or plasma oxidation or nitridation methods, chemical vapor deposition methods (including atomic layer chemical vapor deposition methods) and physical vapor deposition methods (including evaporation methods). Typically, the capacitor dielectric layer 26 comprises a generally higher dielectric constant dielectric material having a thickness intended to completely fill the enlarged aperture A1'".

Figure 11:
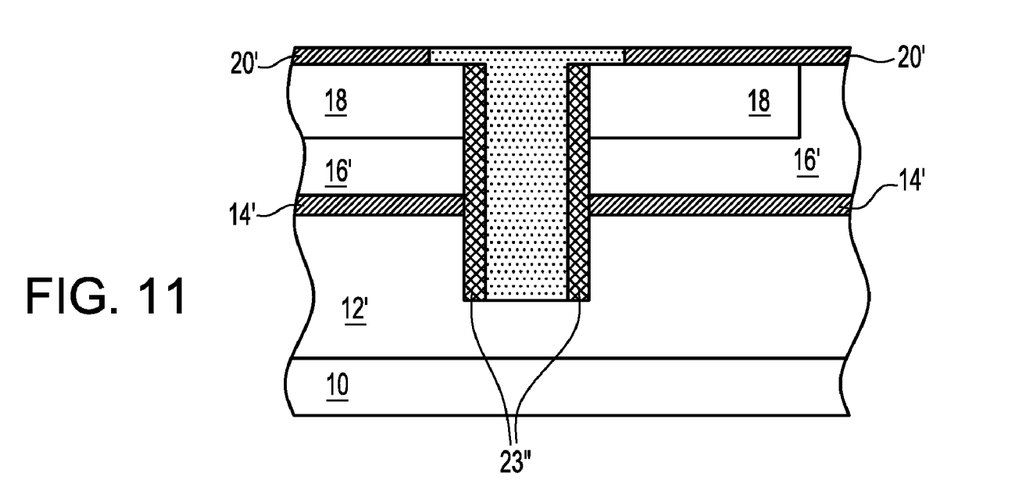

FIG. 11 shows the results of planarizing the capacitor dielectric layer 26 to form a planarized capacitor dielectric layer 26' contained within the enlarged aperture A1'". The capacitor dielectric layer 26 may be planarized to form the planarized capacitor dielectric layer 26' while using any of several planarizing methods. Non-limiting examples of planarizing methods include dry plasma planarizing methods, wet chemical planarizing methods, mechanical polish planarizing methods and chemical mechanical polish planarizing methods. Chemical mechanical polish planarizing methods are generally most common. When using any of the foregoing planarizing methods, the patterned capping layer 20' serves as a stop layer.

FIG. 11 shows a schematic cross-sectional diagram of a microelectronic structure in accordance with a first embodiment of the invention. The microelectronic structure comprises a capacitor structure. The capacitor structure comprises a pair of conductor interconnect layers 18 horizontally separated and embedded within a patterned second dielectric layer 16' located over a substrate 10. The pair of conductor metallization layers 18 terminates at a pair of opposite sidewalls of an aperture that also includes the etched or patterned dielectric layers 12'/14'/16'/20'. A pair of capacitor plates 23" having a spacer form is also: (1) located covering the pair of opposite sidewalls of the aperture and contacting the pair of conductor interconnection layers 18; and (2) not located upon a pair of additional sidewalls of the aperture interposed between the pair of opposite sidewalls upon which are located the pair of capacitor plates 23". Finally, interposed between the pair of capacitor plates 23" is a planarized capacitor dielectric layer 26' that fills the aperture. Thus, a capacitor structure in accordance with the invention comprises, in horizontal progression embedded within a dielectric layer that comprises patterned or etched dielectric layers 12'/14'/16'/20' located over a substrate 10: (1) a first conductor interconnection layer 18; (2) a first capacitor plate layer 23"; (3) a planarized capacitor dielectric layer 26'; (4) a second capacitor plate layer 23"; and (5) a second conductor interconnection layer 18.

The capacitor structure of the invention provides for an enhanced capacitance density and an enhanced quality factor. Both the enhanced capacitance density and the enhanced quality factor result from the options of: (1) forming the capacitor plate layers 23" from different conductor materials than the conductor interconnection layers 18; and (2) forming the capacitor dielectric layer 26' from a different dielectric material than the etched or patterned dielectric layers 12'/14'/16'/20'.

FIG. 12 to FIG. 17 show a series of schematic cross-sectional and plan-view diagrams illustrating the results of progressive stages in fabricating a capacitor structure in accordance with a second embodiment of the invention.

Figure 12:
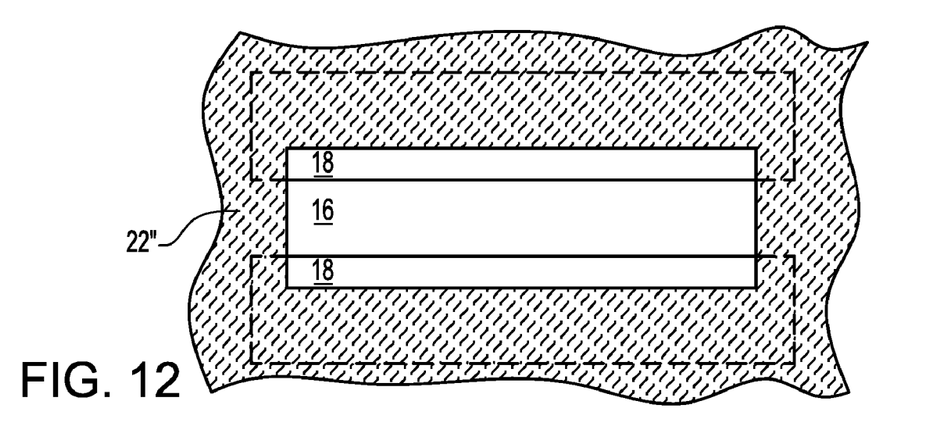
FIG. 12 to FIG. 17 show a series of schematic cross-sectional and plan-view diagrams illustrating the results of progressive stages in fabricating a capacitor structure in accordance with a second embodiment of the invention.

FIG. 12 shows a schematic plan-view diagram of the capacitor structure at an early stage in its fabrication in accordance with the second embodiment of the invention.

FIG. 12 shows a tapered patterned photoresist layer 22". Uncovered by the tapered patterned photoresist layer 22" is a portion of the second dielectric layer 16 that separates the pair of conductor interconnection layers 18. Although not specifically illustrated within the schematic plan-view diagram of FIG. 12, the tapered patterned photoresist layer 22" tapers in the direction of the second dielectric layer 16. The taper may be effected incident to reflow of a patterned photoresist layer analogous, equivalent or identical to the patterned photoresist layer 22' that is illustrated in FIG. 2. Alternatively, the taper may be effected incident to a directional ion milling of an otherwise untapered patterned photoresist layer. Further alternative tapering methods may also be used. Consistent with the first embodiment of the invention, a capping layer while present within the second embodiment is not shown in plan-view for clarity of illustrating other features within the second embodiment. The capping layer will, however, be shown in cross-section view.

Figure 13:
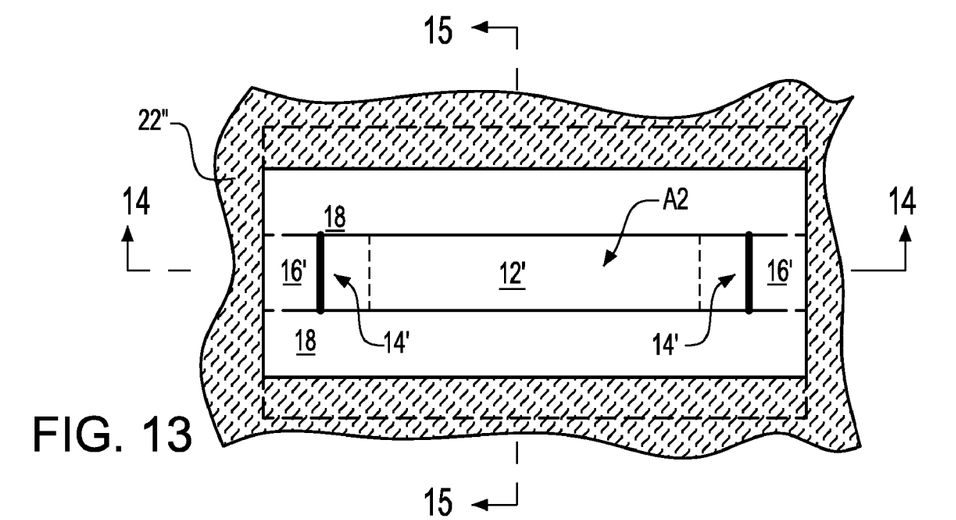

FIG. 13 shows the results of etching the second dielectric layer 16, the etch stop layer 14 and the first dielectric layer 12 to form a patterned second dielectric layer 16', a patterned etch stop layer 14' and an etched semiconductor substrate 12'. Similarly with the first embodiment, the patterned second dielectric layer 16', the patterned etch stop layer 14' and the etched first dielectric layer 12' define an aperture A2. Due to: (1) the presence of the tapered patterned photoresist layer 22" in comparison with a straight sided patterned photoresist layer 22' that is illustrated in FIG. 2; in conjunction with (2) the presence of the pair of conductor interconnect layers 18 as a pair of hard mask layers for forming an opposite pair of sidewalls of the aperture A2, the aperture A2 that is illustrated in FIG. 12 has a pair of straight sidewalls (that includes the pair of conductor interconnection layers 18) separated by a pair of sloped sidewalls. This feature of the second embodiment is illustrated in greater detail by reference to the schematic cross-sectional diagrams of FIG. 14 and FIG. 15.

Figure 14:
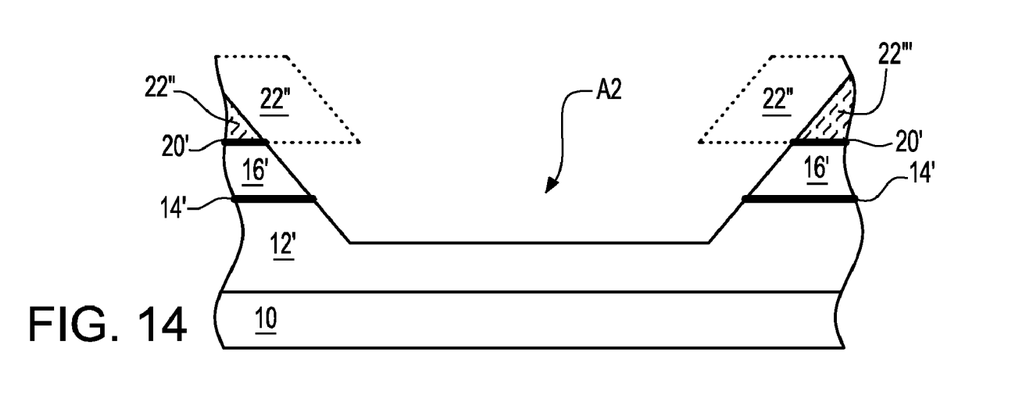

FIG. 14 shows a length-wise schematic cross-sectional diagram corresponding with the schematic plan-view diagram of FIG. 13. FIG. 14 shows the portion of the aperture A2 that includes the sloped sidewalls. The sloped sidewalls are defined by the etched first dielectric layer 12', the patterned etch stop layer 14', the patterned first dielectric layer 16' and the patterned capping layer 20' (i.e., that is shown in cross-sectional view but not shown in plan-view). Also illustrated are the tapered patterned photoresist layer 22" having the inward facing surface taper, and the etched tapered patterned photoresist layer 22'" still having the inward facing surface taper. A taper angle will typically be from about 45 to about 75 degrees with respect to the plane of the substrate 10.

Figure 15:
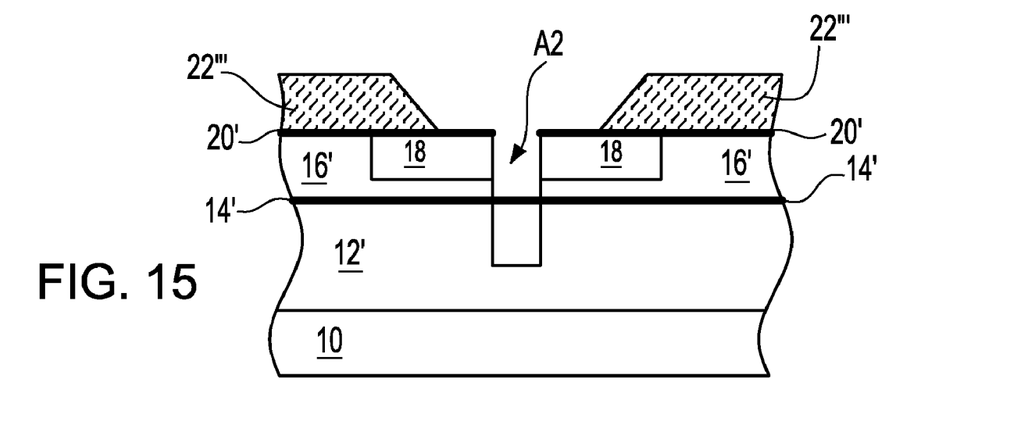

FIG. 15 shows an additional width-wise schematic cross-sectional diagram corresponding with the schematic plan-view diagram of FIG. 13. FIG. 15 also shows the substrate 10 as well as the aperture A2. Within this cross-sectional view, the aperture A2 is defined by the etched first dielectric layer 12', the patterned etch stop layer 14', the patterned second dielectric layer 16', the pair of conductor interconnection layers 18 and the patterned capping layer 20'. As is illustrated by implication within FIG. 15, the pair of conductor interconnection layers 18 act as a hard mask layer when forming the aperture A2.

Figure 16:
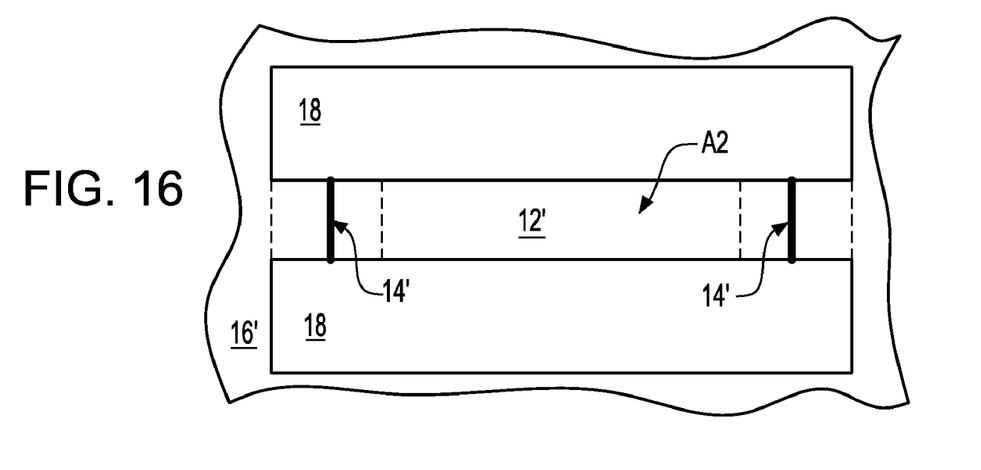

FIG. 16 shows a schematic plan-view diagram illustrating the results of further processing of the microelectronic structure whose schematic plan-view diagram is illustrated in FIG. 13 and whose schematic cross-sectional diagrams are illustrated in FIG. 14 and FIG. 15.

FIG. 16 shows the results of stripping the etched tapered patterned photoresist layer 22'" from the microelectronic structure that is illustrated in FIG. 13, FIG. 14 and FIG. 15. The etched tapered patterned photoresist layer 22'" may be stripped using methods and materials that are conventional in the microelectronic fabrication art. Such methods and materials may include, but are not limited to: wet chemical methods and materials, dry plasma methods and materials and aggregate methods and materials thereof.

Figure 17:
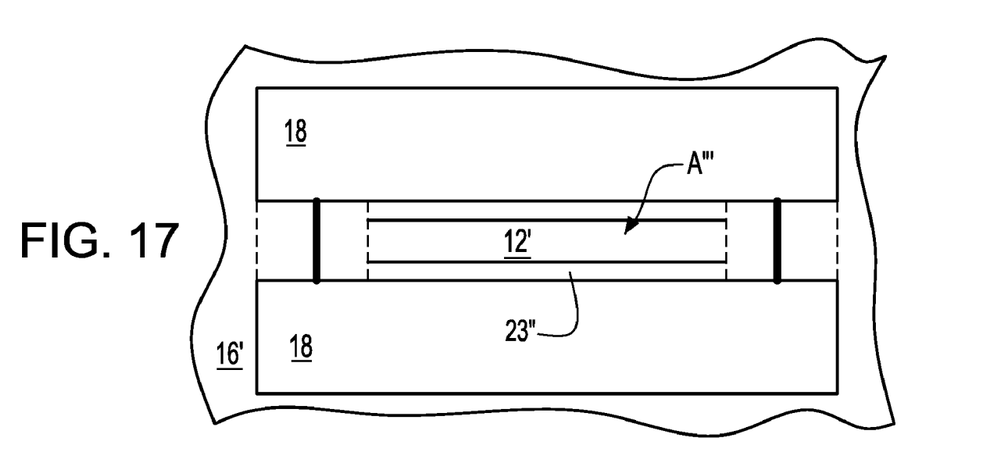

FIG. 17 shows a pair of capacitor plates 23" located contacting the pair of conductor interconnect layers 18. The pair of capacitor plates 23" is formed using the same blanket capacitor plate material layer deposition and anisotropic etch back that is used for forming the pair of capacitor plates 23" within the first embodiment as illustrated in FIG. 4 to FIG. 5. However, since one pair of the sidewalls of the aperture A2 that is illustrated in FIG. 13 to FIG. 16 is sloped, any and all of a capacitor plate material layer formed thereupon is etched off when forming the pair of capacitor plates 23". Thus, while within the first embodiment of the invention the capacitor plates 23" are formed incident to additional patterning of an anisotropically etched capacitor plate material layer 23' that completely surrounds a periphery of an elongated trench A1", within the second embodiment, the pair of capacitor electrodes 23" is formed absent any additional patterning since a pair of opposite sidewalls of the aperture A2 provide for that result.

The microelectronic structure of FIG. 17 may be further fabricated by forming a blanket capacitor dielectric layer thereupon and planarizing the same to form a planarized capacitor dielectric layer in accordance with the first embodiment of the invention, as is illustrated in FIG. 10 and FIG. 11.

FIG. 17 shows a capacitor structure (after addition of a planarized capacitor dielectric layer 26' in accordance with the first embodiment) in accordance with a second embodiment of the invention. For reasons identical with those discussed above with respect to the first embodiment, the capacitor structure in accordance with the second embodiment may also be fabricated with an enhanced capacitance density and an enhanced quality factor. The capacitor structure of the second embodiment also comprises individual structural elements identically referenced as those in accordance with the first embodiment.

The preferred embodiments of the invention are illustrative of the invention rather than limiting of the invention. Revisions and modifications may be made to methods, materials, structures and dimensions in accordance with the preferred embodiments of the invention, while still providing an embodiment in accordance with the invention, further in accordance with the accompanying claims.

What is claimed is:

1. A capacitor structure comprising;
    a dielectric layer located over a substrate, the dielectric layer having at least one aperture located therein;
    a pair of conductor interconnection layers embedded within the dielectric layer, the pair of conductor interconnection layers terminating at a pair of opposite sidewalls of the aperture;
    a pair of capacitor plates located upon the pair of opposite sidewalls of the aperture and contacting the pair of conductor interconnection layers, the pair of capacitor plates not filling the aperture; and
    a capacitor dielectric layer located interposed between the pair of capacitor plates and filling the aperture.

2. The capacitor structure of claim 1 wherein the substrate comprises a semiconductor substrate.

3. The capacitor structure of claim 1 wherein the substrate comprises a ceramic substrate.

4. The capacitor structure of claim 1 wherein:
    the dielectric layer having the at least one aperture located therein comprises a first dielectric material; and
    the capacitor dielectric layer comprises a second dielectric material different from the first dielectric material.

5. The capacitor structure of claim 1 wherein:
    the pair of conductor interconnection layers comprises a first conductor material; and
    the pair of capacitor plates comprises a second conductor material different from the first conductor material.

6. A capacitor structure comprising;
    a dielectric layer located over a substrate, the dielectric layer having at least one aperture located therein, the aperture having a first pair of opposite sidewalls that is at least substantially vertical and a second pair of opposite sidewalls that is interposed between the first pair of opposite sidewalls, the second pair of opposite sidewalls being at least substantially sloped;
    a pair of conductor interconnection layers embedded within the dielectric layer, the pair of conductor interconnection layers terminating at the first pair of opposite sidewalls of the aperture;
    a pair of capacitor plates located upon the first pair of opposite sidewalls of the aperture and contacting the pair of conductor interconnection layers, the pair of capacitor plates not filling the aperture; and
    a capacitor dielectric layer located interposed between the pair of capacitor plates and filling the aperture.

7. The capacitor structure of claim 6 wherein the substrate comprises a semiconductor substrate.

8. The capacitor structure of claim 6 wherein the substrate comprises a ceramic substrate.

9. The capacitor structure of claim 6 wherein the first pair of opposite sidewalls is perpendicular to the second pair of opposite sidewalls.

10. The capacitor structure of claim 6 wherein:
    the dielectric layer having the at least one aperture located therein comprises a first dielectric material and the capacitor dielectric layer comprises a second dielectric material different from the first dielectric material; and
    the pair of conductor interconnection layers comprises a first conductor material and the pair of capacitor plates comprises a second conductor material different from the first conductor material.

* * * * *